United States Patent [19]

Yagi et al.

[11] Patent Number: 4,735,354
[45] Date of Patent: Apr. 5, 1988

[54] METHOD OF SOLDERING COMPONENT ON PRINTED CIRCUIT BOARD

[75] Inventors: Kinsaku Yagi; Yoshinori Iwata, both of Tokyo, Japan

[73] Assignee: Toyo Electronics Corp., Tokyo, Japan

[21] Appl. No.: 927,430

[22] Filed: Nov. 6, 1986

[30] Foreign Application Priority Data

Sep. 19, 1986 [JP] Japan .................. 61-221559

[51] Int. Cl.⁴ ............................................. B23K 31/00
[52] U.S. Cl. ................... 228/180.2; 228/200; 228/212; 228/213; 219/85 D
[58] Field of Search ............ 228/180.2, 212, 213, 228/6.2, 46, 49.2, 49.1, 200; 219/85 D, 85 CM, 85 CA, 85 G

[56] References Cited

U.S. PATENT DOCUMENTS

| | | | |
|---|---|---|---|
| 3,230,338 | 1/1966 | Kawecki | 219/85 D |
| 3,990,863 | 11/1976 | Palmer | 219/85 D |
| 4,437,232 | 3/1984 | Araki et al. | 228/6.2 |
| 4,500,032 | 2/1985 | Ackerman | 228/180.2 |
| 4,605,152 | 8/1986 | Fridman | 228/180.2 |
| 4,605,153 | 8/1986 | Van Den Brekel et al. | 228/180.2 |

FOREIGN PATENT DOCUMENTS

| | | | |
|---|---|---|---|
| 24726 | 2/1980 | Japan | 228/180.2 |
| 54265 | 4/1980 | Japan | 228/180.2 |
| 289525 | 2/1971 | U.S.S.R. | 228/6.2 |
| 670399 | 6/1979 | U.S.S.R. | 228/6.2 |

*Primary Examiner*—Nicholas P. Godici
*Assistant Examiner*—Samuel M. Heinrich
*Attorney, Agent, or Firm*—Schwartz, Jeffery, Schwaab, Mack, Blumenthal & Evans

[57] ABSTRACT

A method of soldering a component on a printed circuit board which has the steps of sucking the components supplied in an irregularly aligned disposition by a feeding sucking nozzle tube, then holding the components by a pair of holding arms of a soldering iron from right and left sides to always direct the component in a predetermined direction, placing the components at predetermined positions on a printed circuit board as in this state, melting the preliminary solder placed in advance on the board, air-cooling to solidify the solder to solder a number of components with a short time by always obtaining the desired designating direction so as not to displace the positions and to locally heat the chip components. Thus, this method can delete thermal adverse influence to the component and obviate an unintentional drop of chip components during the step of feeding the components.

6 Claims, 3 Drawing Sheets

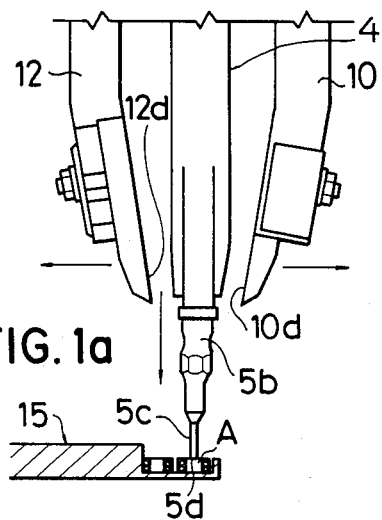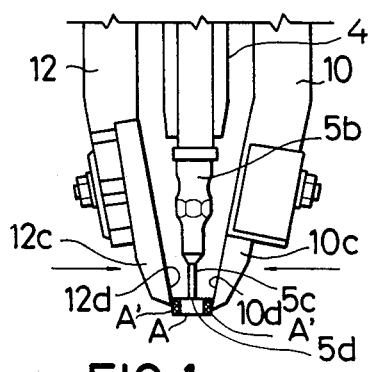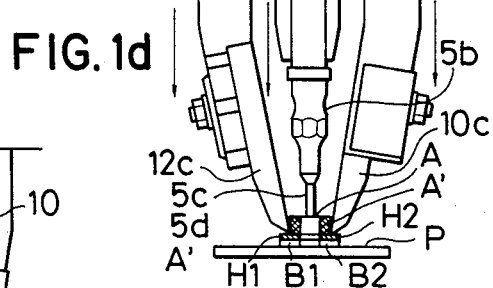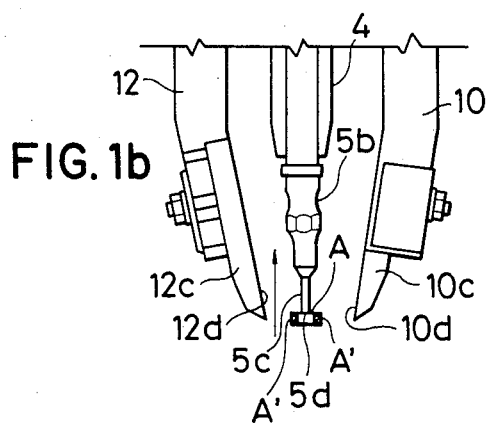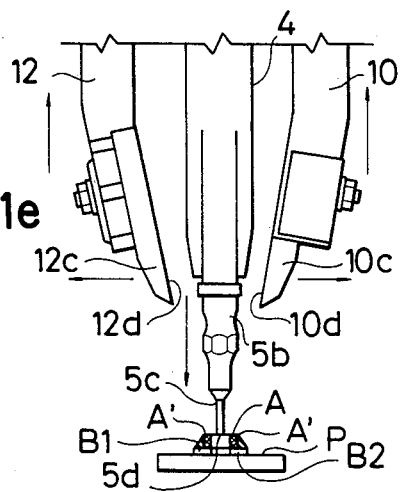

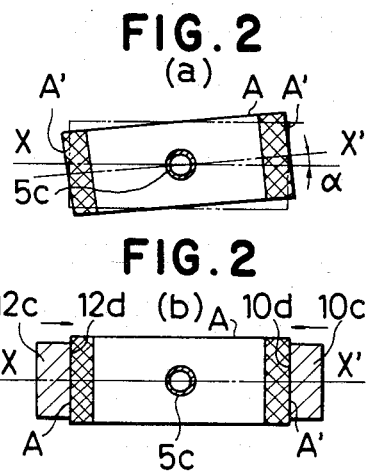
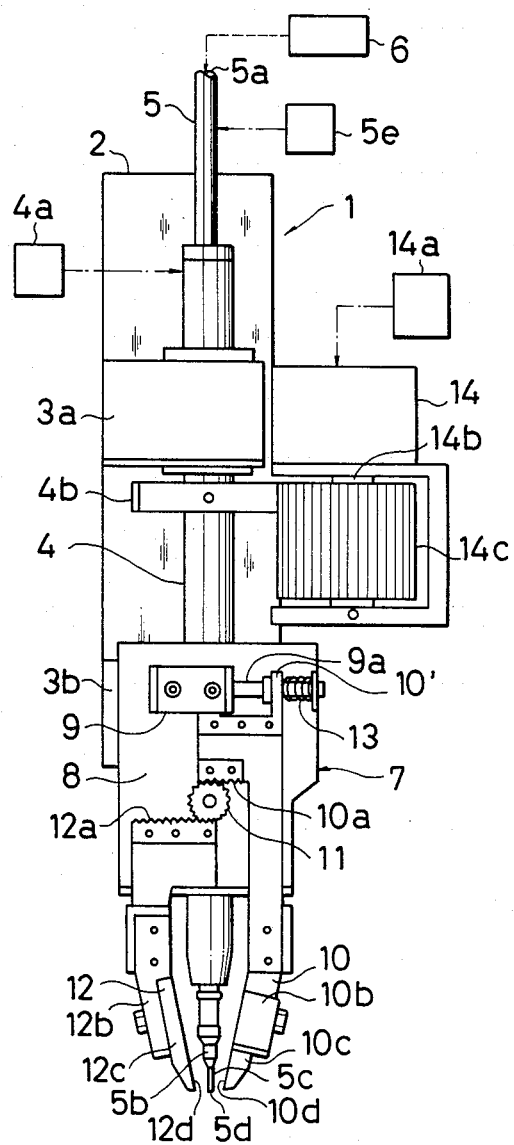

(a)

(b)

METHOD OF SOLDERING COMPONENT ON PRINTED CIRCUIT BOARD

BACKGROUND OF THE INVENTION

This invention relates to a method of soldering components or parts of a square chip or a mellophone type chip on a printed circuit board.

Heretofore, a soldering method includes a reflowing method and a dipping method. In these methods, the step of soldering components of chips is executed as below.

According to the reflowing method, a cream solder is applied by an automatic printing machine on predetermined portions of a printed circuit board, various types of predetermined chip components of necessary number are then placed in a fork-shape at the preliminarily soldering portions coated with the cream solder by an automatic charging machine, the entire board is contained in an automatic reflowing furnace while this state remains unchanged, the cream solder is melted by an infrared ray heating, air-cooled and solidified to simultaneously solder all the chip components by reflowing.

Therefore, the reflowing method should not only employ expensive facility cost for the automatic charging machine and the automatic reflowing furnace, but the chip components placed at the preliminarily soldering positions might be displaced by an external force such as a vibration with the result that the components might be soldered in an erroneously connected state. The work for correcting the displacement later becomes considerably complicated. Since the entire chip components are heated in the automatic reflowing furnace, a thermal adverse influence to the components arises as one of the drawbacks.

According to the dipping method, in means for soldering chip components known per se, cream solder is adhered in advance to predetermined positions on a printed circuit board, an adhesive is applied on the board, chip components to be soldered are bonded on the adhesive by an automatic charging-machine, the chip components are heated in a heating furnace to cure the adhesive, thereby soldering the adhering state of the components so that the state is held immovable, even if an external force such as a vibration occurs or the board is overturned upside down, the components are then heated at high temperatures by a soldering iron to melt the cream solder, the melted solder is then air-cooled and solidified.

According to the dipping method in this manner, various devices are required in addition to the reflowing method, expensive facility investments are not only required but the step of applying the adhesive is necessary in addition to the coating of the cream solder, and heating operation of curing the adhesive is required. Thus, considerable labor and time of soldering must be not only inefficiently consumed, but an expansion and contraction arise in a period due to the heating and cooling steps of the adhesive. At this time the chip components might be removed from the designated positions so that the array of the chip components becomes irregular to reduce the vague of a product. Thus, there are drawbacks of having to check and correct the positions of the components.

SUMMARY OF THE INVENTION

Accordingly, an object of this invention is to provide a method of soldering a component on a printed circuit board which can eliminate the above-mentioned drawbacks of the conventional methods and can delete thermal adverse influence to the component and obviate an unintentional drop of chip components during the step of feeding the components, by sucking the components supplied in an irregularly aligned disposition by a feeding sucking nozzle tube, then holding the components by a pair of holding arms of a soldering iron from right and left sides to always direct the component in a predetermined direction, placing the components at predetermined positions on a printed circuit boards as in this state, melting the preliminary solder placed in advance on the board, and air-cooling to solidify the solder, to solder a number of components within a short time by always obtaining the desired designating direction so as not to displace the positions and to locally heat the chip components.

Another object of this invention is to provide a method of soldering a component on a printed circuit board which additionally, slightly separates the arms of the soldering iron from the chip components in case of melting the preliminary solder by the arms to sufficiently strengthen the secured state of the chip components by utilizing a capillary tube phenomenon to eliminate improper contact and to finish the solidified state of the melted preliminary solder satisfactorily.

Still another object of this invention is to provide a method of soldering a component on a printed circuit board which can accelerate accurately the solidification of the melted preliminary solder by cooling, by feeding air at a suitable time from a lower nozzle of a feeding intaking nozzle tube activating for feeding to such the chip components to improve the efficiency and to enhance the reliability of soldering.

According to one aspect of the invention, there is provided a method of soldering a component on a printed circuit board which comprises the steps of placing a feeding intaking nozzle tube capable of sucking on the upper surface of the component to be supplied to a predetermined position, to cause contact with the component and the lover end of the nozzle when the component is in the sucked state, then holding the component by a pair of holding arms of a soldering iron that are in a heated state, and disposed at both right and left sides of the nozzle tube, thereby pressing the opposed holding ends of the arms to direct the components toward a reference axis perpendicularly crossing the holding ends, preheating the electrodes of the components, pressing the components in a fork shape on a plurality of preliminary soldering positions to be adhered in advance at predetermined positions on the printed circuit board in this state to melt the preliminary solder by the heat transfer through the ends of the arms, separating the arms from the electrode ends of the components while allowing the components pressed by the lower nozzle of the nozzle tube to remain as it is, and raising the nozzle tube after the preliminary solder starts solidifying to separate the lower nozzle end from the components.

According to another aspect of this invention, there is provided a method of soldering a component on a printed circuit board which additionally comprises, in case of the first aspect of the invention, the steps of flowing the melted preliminary solder by means of capillary tube phenomenon into a fine gap between the holding ends of the holding arms and the electrode ends of the component in the case of melting the preliminary solder by the heat transfer through the ends of the arms, separating the arms from the electrode ends of the components while allowing the components pressed by the lower nozzle of the nozzle tube to remain as it is, and the nozzle tube after the preliminary solder starts solidifying to separate the lower end from the components.

According to still another aspect of this invention, there is provided a method of soldering a component on a printed circuit board which additionally comprises, in case of the first aspect of the invention, the step of quickly cooling the melted preliminary solder by gas supplied to the nozzle tube in the state of separating the arms from the electrode ends of the components while allowing the components pressed by the lover nozzle of the nozzle tube to remain as it is, and raising the nozzle tube after the preliminary solder starts solidifying to separate the lover end from the components.

The above and other related objects and feature of the invention will be apparent from a reading of the following description of the disclosure found in the accompanying drawings and the novelty thereof pointed out in the claims.

BRIEF DESCRIPTION OF THE DRAWINGS

FIGS. 1(a) to 1(e) are explanatory views of the essential portion of soldering irons with respect to a method of soldering a component on a printed circuit board according to a first embodiment of this invention;

FIGS. 2(a) and 2(b) are plain explanatory views showing the relationships between the component in the step in FIG. 1(c) and the first and second holding arms of the soldering iron;

FIG. 3 is a schematic front view of the soldering iron to be used for executing the method of this invention.

DESCRIPTION OF THE PREFERRED EMBODIMENTS

Figure 4:
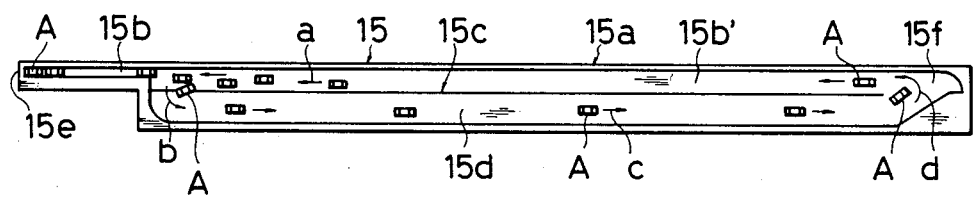
FIGS. 4(a) and 4(b) are plain and perspective views of an example of a linear feeder capable of supplying the component directly under the soldering iron.
Figure 4:
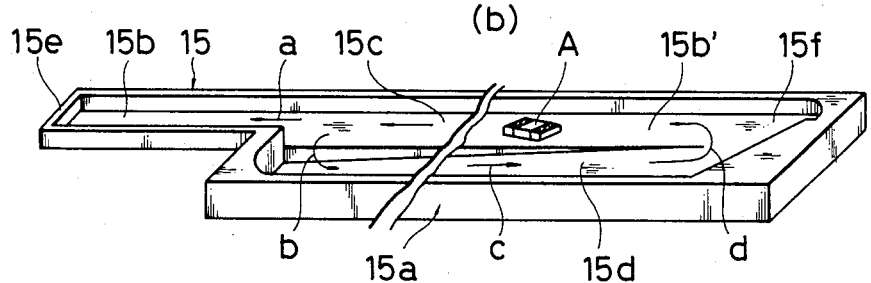

This invention will be described in detail with reference to the accompanying drawings.

A soldering iron 1 to be used for executing a method of this invention will be first described in detail with reference to FIG. 3. The soldering iron may be of a manual or an automatic type operated by desired power. FIG. 3 shows the latter iron. In FIG. 3, reference numeral 2 designates a base, which can feed the soldering iron 1 to a predetermined position of a printed circuit board P (in FIG. 1) by a feeder, not shown, to be described later. If the manual soldering iron is employed, the iron is fed manually in this case.

From the base 1, upper and lower journaling arms 3a and 3b are laterally projected forwardly, and a main elevational shaft 4 vertically journalled through the arms 3a dna 3b perpendicularly to the arms 3a and 3b is elevationally movably controlled by a first air cylinder 4a, i.e., can be moved upwardly or downwardly by switching the air from an air source to the cylinder 4a flow normally or reversely by the switching operation of a known solenoid valve satisfactorily.

A feeding intaking nozzle tube 5 is engaged in a penetrating state to be elevationally movable in upward and downward directions within the main shaft 4. The upper end 5a of the nozzle tube 5 is communicated with an intake and exhaust unit 6 made, for example, of a vacuum pump and a blower, which is operated to intake from the nozzle tube 5 by the vacuum pump and to feed to the nozzle tube 5 by the blower. The lower end 5b of the nozzle tube 5 extended from the main shaft 4 is provided with a lower end nozzle 5c in such a manner that the nozzle port 5d of the nozzle 5c is formed of a flat smooth surface perpendicular to the axis of the nozzle tube 5. The nozzle tube 5 is elevationally movable along the axial center of the main shaft 4 in upward and downward directions separately from the main shaft 4 by the operation of a second air cylinder 5e in the same operation as that by the upward and downward movements of the main shaft 4 by the first air cylinder 4a.

A base plate 8 of an iron actuator 7 is fixedly secured to the lower end of the main shaft 4 and faces the main shaft 4 in a longitudinally mounted state. On the base plate 8 are provided an opening and closing air cylinder 9, a first holding arm 10 laterally movable in rightward and leftward directions by the air cylinder 9, a pinion 11 engaged with a downward rock 10a, and a second holding arm 12 having an upward rack 12a engaged with the pinion 11 to be laterally movable in rightward and leftward directions.

When air is supplied from an air source by a solenoid valve to the cylinder 9 at an adequate time in a switching manner, the plunger 9a of the cylinder 9 is telescopically extended. Thus, the first arm 10, the upper end 10' of which is fixedly secured to the plunger 9a of the cylinder 9, moves laterally against the tension of a balance spring 13 coiled on the plunger 9a to urge the plunger 9a to the let the second arm 12 to approach the first arm 10. In this case, the pinion 11 engaged with the rack 10a of the first arm 10 rotates to allow the second arm 12 to laterally move in the leftward direction of FIG. 3 by the upward rack 12a engaged with the pinion 11. Since the first and second arms 10 and 12 are disposed oppositely, both the arms 10 and 12 move to separate from one another, i.e., in the opening direction. When the air flowing direction to the cylinder 9 is switched, the first and second arms 10 and 12 move reversely to the above operations, and both the arms 10 and 12 move to approach to one another, i.e., in the closing direction.

The first and second arms 10 and 12 have heat insulating blocks 10b and 12b, and ceramic heaters 10c and 12c provided at the lower ends thereof. The lower most edges of the holding end faces 10d and 12d formed on the inner surfaces of the ceramic heaters 10c and 12c are parallel to one another to be perpendicular to a reference axis X—X' designated by dotted chain line in FIG. 2 to be described in detail later, and the lower end nozzle 5c of the nozzle tube 5 is moved down to the neutral point position of the first and second arms 10 and 12 on a rectilinear line for connecting the holding end faces 10d and 12d of the first and second arms 10 and 12.

A rotary actuator 14 is fixedly secured to the base 2 of the soldering iron 1 shown in FIG. 1, and normally or reversely rotated by a rotary air cylinder 14a to rotate a spline 14c having a rotational shaft 14b longitudinally clockwise or counterclockwise.

Since a rotary gear 4b is journaled at the middle height on the main shaft 4 in engagement with the spline 14c, the main shaft 4 is rotated at a desired angle by the rotation of the spline 14c without disturbing the elevational movements of the main shaft 4, and the reference axis X—X' described above can be altered at a predetermined angle as required.

The method of this invention is executed by the soldering iron 1 in the following steps as designated in FIGS. 1(a) to 1(e).

Components A to be soldered such as chip components in the embodiment exemplified in the drawings are sequentially fed by a linear feeder 15 designated in FIG. 1(a) and more particularly in FIGS. 4(a) and 4(b) to a predetermined position to be sequentially soldered.

The feeder 15 has, in an elongated supply unit 15a known per se, a linear main passage 15c having a leading supply passage 15b and a forward supply passage 15b', and a return passage 15d provided at a lower position that the supply passage 15b' in parallel with the supply passage 15b'. The feeder 15 further has a stopper 15e formed at the end of the leading passage 15b, and a turning passage 15f formed so that the return passage 15d and the forward passage 15b are disposed in the same height by gradually reducing the depth from the leading passage 15b.

When a vibration is applied to the supply unit 15a, the components A on the forward passage 15b are moved forward in the leftward direction as designated by an arrow a in FIG. 4(a), and further moved into the leading passage 15b to push the stopper 15e. Thus, when the leading passage 15b is filled fully with the components A, the components A are dropped from the end side of the forward passage 15b to the return passage 15d, and then moved on the return passage 15d in the direction of an arrow c in Fig. 4(a) this time, returned from the turning passage 15f to the forward passage 15b', as designated by an arrow b in FIG. 4(a), and again moved forward to the leading passage 15b. Thus, the components A thus pushed in contact with the stopper 15e are sequentially soldered.

Then, the soldering iron 1 is first operated to be moved by a feeder, not shown, to the position directly above the component A pushed in contact with the stopper 15e, the nozzle tube 5 is moved down by the second air cylinder 5e, the nozzle portion 5d of the nozzle 5c is contacted with the upper surface of the component A, preferably with the center of the upper surface of the component A, the intake and exhaust unit 6 is set to the intake state in this case to thus intake and lift the component A, the nozzle 5 is then raised as designated by FIGS. 1(a) and 1(b), and the component A is thus disposed between the holding end faces 10d and 12d of the first and second holding arms 10 and 12.

When thus disposed as described above, the first and second arms 10 and 12 are then laterally moved in rightward and leftward directions as designated in FIG. 1(c) by the operation of the cylinder 9, subsequently pushed in contact with the electrode ends A' and A' of the component A by the holding end faces 10d and 12d to thus hold the component A.

When the components A sequentially supplied by the linear feeder 15 are picked up as designated in FIG. 2(a) by the steps as described above, even if the component A is, for example, displaced at an angle α with respect to the reference X-X' as designated by a solid line in FIG. 2(a), the component A is rotated at the angle α as designated in FIG. 2(b) by holding the component A at the electrode ends A' and A' by the holding end faces of the first and second arms to be altered to the direction coincident to the reference axis X-X' and the component A irregularly directed is always corrected to the standard state coincident to the reference axis.

Therefore, when the component of the held state in the following step is placed at a predetermined position to be described later on a printed circuit board B in a predetermined direction, the component can not only be placed while holding the standard state described above, but also the component A of the held state can be rotatably displaced at a desired angle in a horizontal state, and can be placed on the printed circuit board B in this displaced direction by the soldering iron 1 according to the embodiment of the method of this invention exemplified in the drawings.

When the rotary displacement of the component A is required due to the necessity of working steps, the air cylinder 14a is operated, and the spline 14c is rotated by the actuator 14 to rotate the main shaft 4 through the gear 4b at a desired angle in the soldering iron 1 as shown. Thus, the first and second arms 10 and 12 are rotated at the reference axis X-X'.

When the component A is thus held, the ceramic heaters 10c and 12c are energized in advance or at the same time as the holding steps of the first and second arms, and the electrodes of the component A are preheated until the component A thus held is placed at a predetermined position on the printed circuit board B as designated in FIG. 1(d).

More particularly, the soldering iron 1 is laterally moved from the component preheating state shown in FIG. 1(e) by a feeder constructed suitable as described above. Then, when the first and second holding arms 10 and 12 and the intaking nozzle tube 5 is integrally moved down as designated in FIG. 1(d), the component A is placed in a fork shape on preliminary solders H1 and H2 of cream solder adhered in advance to wiring metals B1 and B2 on the printed circuit board B.

Thus, the lower ends of the ceramic heaters 10c and 12c of the first and second holding arms 10 and 12 are pushed in contact with the solders H1 and H2, respectively, and the solders are thus melted extremely rapidly since the component A is preheated.

When the solders are melted, the first and second arms 10 and 12 are preferably slightly moved outward to separate the arms 10 and 12 from the solders.

By the operation as described above, fine gaps are formed between the holding end faces 10d and 12d of the ceramic heaters 10c and 12c and the electrode ends A' and A' of the component A, the melted solders are flowed to the gaps by means of capillary phenomenon, and the solders of the electrode ends A' and A' can be sufficiently wetted.

When the above-mentioned fine gaps are formed or the preliminary solders are sufficiently melted without forming the gaps, the first and second arms 10 and 12 are operated while the nozzle tube 5 is held at the position as designated in FIG. 1(e), i.e., the component A remains pushed in contact by the nozzle port 5d of the nozzle 5b, thereby separating the arms 10 and 12 from the melted solder.

It is preferable to operate the first air cylinder 4a to move the main shaft 4 while opening the ceramic heaters 10c and 12c laterally in the rightward and leftward directions so as to separate the arms 10 and 12. When the component A is small, it is preferable for the wetting of the solders or the finishing gloss to lift the arms 10 and 12 without opening the heaters 10c and 12c nor holding the component A since the corners of the solders are not projected in case of finishing the component.

In the final step, after the melted solder starts solidifying, the nozzle tube 5 pushed in contact with the component A so far is raised by the operation of the second air cylinder 5e. It is preferable to stop the intaking operation of the intake and exhaust unit 6 in the state that the arms are pushed in contact, and the intaking force is not accordingly applied to the component A when the nozzle tube 5 is raised.

When the nozzle tube 5 is raised, if the component A is large or the printed circuit board B has low heat dissipation effect, the intake and exhaust unit 6 is set to the exhausting state. Thus, air is blown from the nozzle port 5d of the nozzle 5c toward the component A to preferably forcibly air-cool the component A, thereby improving the solder wetting state and the gloss of the component A to enhance the reliability of soldering.

As described above, when one cycle of soldering according to the method of the invention is finished, the soldering iron 1 is returned to the original position by a feeder and the like, and the next component A again supplied by the linear feeder 15 as in FIG. 1 (a) is soldered by moving down the nozzle tube 5 and then raising the tube 5 by intaking.

According to one aspect of the invention executed as described above, the component A is not grasped by a retainer, but carried by intaking means of feeding intaking nozzle. Therefore, the component A is lifted even for ship components of rectangular parallelepiped shape supplied in any direction.

Further, since the component A is then held by the first and second holding arms, the directivity of the component taken as displaced from the reference axis X-X' is corrected by the operation in the steps and the directivity of the component coincident to the reference axis X-X' is obtained. Therefore, the component can be placed correctly in the desired direction on the printed circuit board, thereby providing the satisfactory finish of the component.

Since the component is not heated entirely as by the conventional reflow furnace but heated only at the electrodes by the first and second holding arms, the thermal adverse influence of the component can be extremely reduced and the component is preheated at feeding time. Therefore, the preliminary solders on the printed circuit board are melted in a short time, the component can be efficiently soldered. Since the intaking force of intaking continuously acts at component feeding time, the component will not be unintentionally dropped as may occur with conventional apparatus that only grasp the component.

According to second aspect of the method of the invention as described above, the first and second holding arms are slightly opened in case of the steps of melting the preliminary solders in addition to the first aspect of the invention. Therefore, the wetting of the solder and the gloss of the component are improved to improve the reliability, and preferable finishing component can be provided.

According to third aspect of the method of the invention as described above, air is exhausted from the nozzle tube elevationally movable in upward and downward directions in case of solidifying the melted solders in the final steps in addition to the first aspect of the invention. Therefore, the soldering work can be more rapidly completed, and the wetting of the solder and the gloss of the components are preferably improved.

What is claimed is:

1. A method of soldering a component on a printed circuit board which comprises the steps of:
    placing a feeding intaking nozzle tube, capable of a sucking action when activated, on the upper surface of the component to be supplied to a predetermined position to cause contact between a lower end of the nozzle and the component, activating the sucking action of the nozzle tube, and lifting the component,
    holding the component by a pair of holding arms of a soldering iorn disposed at both right and left sides of the nozzle tube, thereby pressing the opposed holding ends of the arms to direct the component toward a reference axis perpendicularly crossing the holding ends,
    preheating the electrode ends of the components with the holding arms of the soldering iron,
    pressing the component on a preliminary soldering position prepared in advance at a predetermined position on the printed circuit board with solder and melting the solder by the transfer of heat through the ends of the holding arms,
    separating the holding arms from the electrode ends of the component while allowing the component pressed by the lower nozzle of the nozzle tube to remain at the preliminary soldering position, and,
    raising the nozzle tube after the solder starts solidifying to separate the lower nozzle end from the component.

2. The method according to claim 1, wherein to place the component at the predetermined position on the printed circuit board, the holding arms of the soldering iron are rotated integrally with the nozzle tube at a predetermined angle with respect to the reference axis of the holding arms as a reference.

3. The method according to claim 1, wherein to separate the holding arms of the soldering iron from the electrode ends of the components disposed on the printed circuit board, the holding arms are opened laterally in the rightward and leftward direction.

4. The method according to claim 1, wherein when the component is pressed to contact the preliminary solder position, the suction action of the nozzle tube is stopped.

5. A method of soldering a component on a printed circuit board which comprises the steps of:
    placing a feeding intaking nozle tube, capable of a sucking action when activated on the upper surface of the component to be supplied to a predetermined position to cause contact between a lower end of the nozzle and the component, activating the sucking action of the nozzle tube, and lifting the component,
    holding the component by a pair of holding arms of a soldering iron disposed at both right and left sides of the nozzle tube, thereby pressing the opposed holding ends of the arms to direct the components toward a reference axis perpendicularly crossing the holding ends,
    preheating the electrode ends of the components with the holding arms of the soldering iron,
    pressing the component on a preliminary soldering position prepared in advance at a predetermined position on the printed circuit board with solder, melting the solder by the transfer of heat through the ends of the holding arms,
    flowing the melted solder by means of capillary tube phenomenon into a fine gap between the holding ends of the holding arms and the electrode ends of the component,
    separating the holding arms from the electrode ends of the components, while allowing the components pressed by the lower end of the nozzle tube to remain in place, and, raising the nozzle tube after the solder starts solidifying to separate the lower end of the nozzle from the component.

6. A method of soldering a component on a printed circuit board which comprises the steps of:

placing a feeding intaking nozzle tube, capable of a sucking action when activated on the upper surface of teh component to be supplied to a predetermined position to cause contact between a lower end of the nozzle and the component, activating the sucking action of the nozzle tube, and lifting the component, holding the component by a pair of holding arms of a soldering iron disposed at both right and left sides of the nozzle tube, thereby pressing the opposed holding ends of the arms to direct the components toward a reference axis perpendicularly crossing the holding ends, preheating the electrode ends of the component with the holding arms of the soldering iron, pressing the component on a preliminary soldering position prepared in advance with solder at a predetermined position on the printed circuit board and melting the preliminary solder by the transfer of heat through the ends of the holding arms, quickly cooling the melted solder by gas supplied by the nozzle tube and separating the holding arms from the electrode ends of the component, while allowing the component pressed by the lower end of the nozzle tube to remain in place, and, raising the nozzle tube after the solder starts solidifying to separate the lower nozzle end from the components.

* * * * *